United States Patent [19]
Ochi et al.

[11] Patent Number: 5,804,840
[45] Date of Patent: Sep. 8, 1998

[54] SEMICONDUCTOR DEVICE STRUCTURE INCLUDING INALAS OR INALGAAS CURRENT BLOCKING LAYERS

[75] Inventors: Seiji Ochi; Manabu Kato, both of Tokyo, Japan

[73] Assignee: Mitsubishi Denki Kabushiki Kaisha, Tokyo, Japan

[21] Appl. No.: 634,948

[22] Filed: Apr. 19, 1996

[30] Foreign Application Priority Data

Jun. 27, 1995 [JP] Japan ................................. 7-160900

[51] Int. Cl.⁶ ........................................... H01L 33/00
[52] U.S. Cl. .......................... 257/94; 257/101; 257/103; 372/45
[58] Field of Search .............................. 257/94, 103, 102, 257/101; 372/45, 46, 50; 359/248

[56] References Cited

FOREIGN PATENT DOCUMENTS

| | | |
|---|---|---|
| 314372 | 5/1989 | European Pat. Off. . |
| 416477 | 3/1991 | European Pat. Off. . |
| 55-18087 | 2/1980 | Japan . |
| 4127490 | 4/1992 | Japan . |
| 6177487 | 6/1994 | Japan . |

OTHER PUBLICATIONS

Macrander et al., "Electrical And Structural Characterization Of Highly Perfect Semi–Insulating InAlAs Grown By Molecular Beam Epitaxy", Journal of Crystal Growth, vol. 92, 1988 pp. 83–87.

Ishikawa et al., "Highly Resistive Iron–Doped AlInAs Layers Grown By Metalorganic Chemical Vapor Deposition", Japanese Journal of Applied Physics, vol. 31, 1992, pp. L376–L378.

Willardson, et al.; "Indium Phosphide: Crystal Growth and Characterization"; vol. 31, Academic Press, Inc., 1990, pp. 93–95 & 130–137.

Sasaki, et al.; "Selective MOVPE Growth and Its Application to Semiconductor Photonic Integrated Circuits"; Electronics and Communications in Japan, Part 2, vol. 76, No. 4, 1993, pp. 1–11.

Aoki et al., "High–Speed (10 Gbit/s) and Low–Drive–Voltage (IV Peak to Peak) . . . Buried Hetrostructure", Electronics Letters, Jun. 4, 1992, vol. 28, No. 12.

Ishikawa, Hiroshi; "Semiconductor Laser Light Sources and Receivers for Next Generation Optical Communication Systems"; Fujitsu Scientific and Tech. Jounal, Dec. 1991, vol. 27, pp. 329–337.

Guido et al.; "Carbon–doped $Al_xGa_{1-x}As$–GaAs quantum well lasers" Appl. Phys. Lett., Feb. 1998, pp. 522–524.

Gotoda et al.; "Extremely smooth vertical facets . . . beam epitaxy regrowth"; Journal of Crystal Growth, 145 (1994) pp. 675–679.

(List continued on next page.)

Primary Examiner—Minh-Loan Tran
Attorney, Agent, or Firm—Leydig, Voit & Mayer, Ltd.

[57] ABSTRACT

A method of fabricating a semiconductor device includes forming a stripe-shaped first insulating film on a semiconductor layer; using the first insulating film as a mask, etching the semiconductor layer to a depth to form a stripe-shaped ridge including a portion of the semiconductor layer left under the first insulating film; using the first insulating film as a mask, growing, by MOCVD, a high-resistance layer, selected from InAlAs and InAsGaAs, contacting both sides of the ridge structure, the high-resistance layer having a shallow donor concentration $N_{SD}$, a shallow acceptor concentration $N_{SA}$, and a deep donor concentration $N_{DD}$ in relationships of $N_{SA}>N_{SD}$ and $N_{SA}-N_{SD}<N_{DD}$; removing the first insulating film; forming a second insulating film covering the high-resistance layer; and forming a surface electrode on the semiconductor layer at the ridge structure.

4 Claims, 6 Drawing Sheets

OTHER PUBLICATIONS

Okayasu et al.; "Metalorganic vapor phase epitaxial growth for buried heterostructure GaAlAs lasers with semi–insulating blocking layers"; Appl. Phys. Lett. Dec. 14, 1987, pp. 1980–1982.

Zah et al.; "High–Speed . . . Current Blocking Layers"; Electronics Letters, Mar. 1988, vol. 24, No. 11, pp. 695–697.

Lourdudoss et al.; "High–Frequency GaInAsP InP . . . Semi–insulating InP: Fe"; IEEE Photonics Technology Letters, 1993, vol. 5, No. 10 pp. 1119–1122.

Sanada et al.; "Planar–embedded InGaAsP/InP . . . chemical vapor deposition"; Appl. Phys. Lett., Aug., 1987, vol. 51, No. 14, pp. 1054–1056.

Wakao et al.; "InGaAsP/InP Planar Heterostructure Lasers with Semi–Insulating InP Current Blocking Layers Grown by MOCVD"; IEEE Journal of Quantum Electronics, Jun. 1987, vol. QE–23, No. 6, pp. 943–947.

Tanahashi et al.; "Liquid Phase Epitaxial Growth of Fe–Doped Semi–Insulating InP, GaInAsP, and AlGaInAs"; Fujitsu Scientific and Technical Journal, Sep., 1988, pp. 242–253.

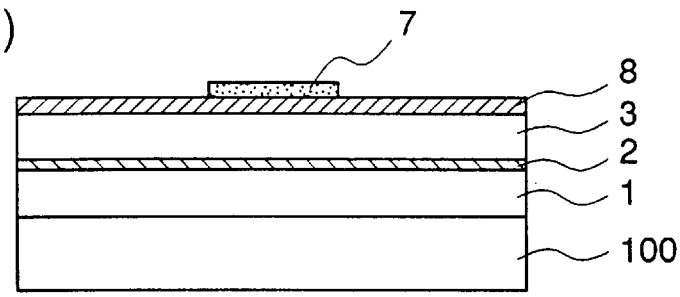
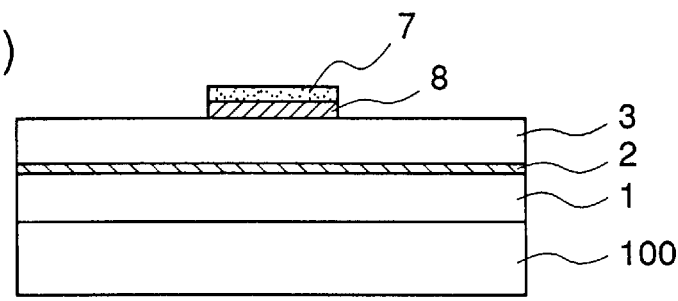
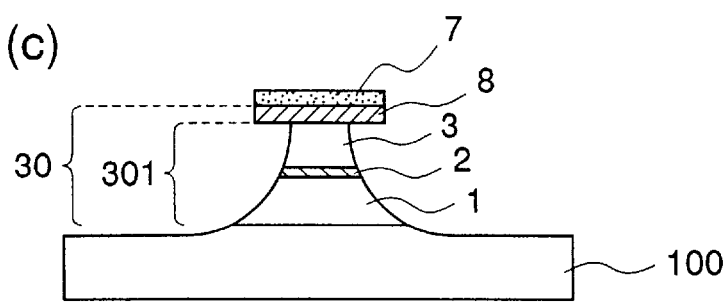
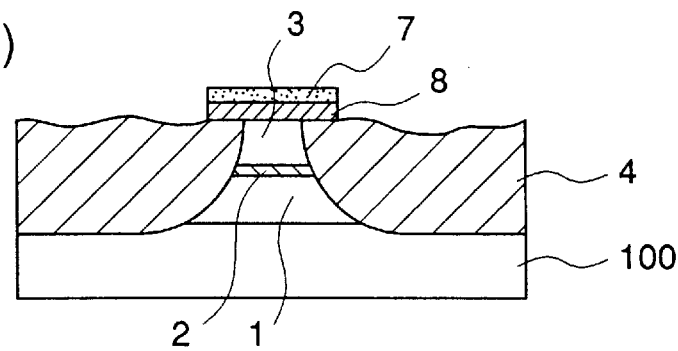
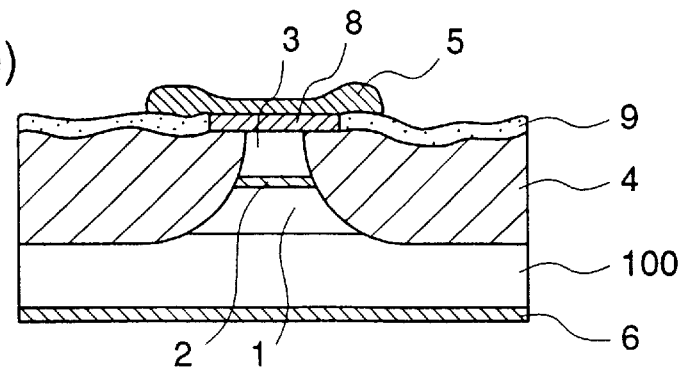

SEMICONDUCTOR DEVICE STRUCTURE INCLUDING INALAS OR INALGAAS CURRENT BLOCKING LAYERS

FIELD OF THE INVENTION

The present invention relates to methods of fabricating semiconductor devices including high-resistance layers grown by metalorganic chemical vapor deposition (hereinafter referred to as MOCVD) for current blocking layers. The invention also relates to the semiconductor devices fabricated using the methods.

BACKGROUND OF THE INVENTION

A description is given of a prior art method of fabricating a semiconductor laser device including high-resistance InAlAs layers grown by MOCVD at both sides of a ridge structure. FIGS. 6(a)–6(d) are sectional views for explaining the prior art method.

Initially, as illustrated in FIG. 6(a), an n type InP lower cladding layer 1, an undoped InGaAsP active layer 2, and a p type InP upper cladding layer 3 are successively grown on an n type InP substrate 100 by MOCVD. Thereafter, SiN is deposited over the entire surface of the p type InP upper cladding layer 3 and patterned by photolithography and etching technique to form a stripe-shaped SiN film 7 as shown in FIG. 6(b). The stripe direction is perpendicular to the cross-section of the figure.

In the step of FIG. 6(c), using the SiN film 7 as a mask, the semiconductor layers grown on the substrate 100 are wet-etched to form a stripe-shaped ridge structure 30 comprising portions of the semiconductor layers. Since the wet-etching proceeds not only perpendicular to the surface of the substrate but also parallel to the surface both side surfaces of the ridge structure 30 just beneath the SiN film 7 are positioned underneath the SiN film 7.

In the step of FIG. 6(d), using the SiN film 7 as a mask, a high-resistance InAlAs layer 4 and an n type InP layer 21 are selectively grown so as to fill spaces at both sides of the ridge structure 30, which spaces are formed by the wet-etching of the semiconductor layers. The high-resistance InAlAs layer 4 serves as a current blocking layer for concentrating current to the ridge structure 30, and the n type InP layer 21 suppresses injection of holes into the high-resistance InAlAs layer 4. Since the growth temperature for the high-resistance InAlAs layer 4 is relatively low, these layers tightly adhere to portions of the rear surface of the SiN film 7 exposed at the both sides of the ridge structure 30.

The high-resistance InAlAs layer 4 is grown so that the shallow donor concentration $N_{SD}$, the shallow acceptor concentration $N_{SA}$, and the deep donor concentration $N_{DD}$ included in that layer 4 have relationships of $N_{SA} > N_{SD}$ and $N_{SA} - N_{SD} < N_{DD}$. When an undoped InAlAs layer is grown by MOCVD, by setting the growth temperature to about 500° C., that is, is lower than the ordinary growth temperature of 600°–700° C., the concentration of carbon (C) that is incorporated into the growing layer is increased. This C is an impurity that serves as shallow acceptor in InAlAs. Therefore, the above-described $N_{SA}$ can be made larger than the concentration $N_{SD}$ of the shallow donor comprising residual impurities, such as Si. Further, since oxygen serving as a deep donor is incorporated into the undoped InAlAs layer and the concentration of the oxygen is significantly larger than $N_{SA}$ and $N_{SD}$, the relationship of $N_{SA} - N_{SD} < N_{DD}$ is established. In this way, in the high-resistance InAlAs layer 4, the shallow donor is compensated by the shallow acceptor comprising mainly carbon, and the shallow acceptor having a concentration higher than the concentration of the shallow donor is compensated by the deep donor comprising mainly oxygen, whereby a high resistivity exceeding $5 \times 10^4$ Ω·cm is obtained.

The impurity contained in the high-resistance InAlAs layer 4 and serving as a shallow acceptor is not restricted to carbon. For example, doped beryllium or magnesium may be used. When oxygen serving as a deep donor is further doped, the deep donor concentration $N_{DD}$ is increased and the range of the shallow acceptor concentration $N_{SA}$ that satisfies $N_{SA} - N_{SD} < N_{DD}$ is increased, whereby control of $N_{SA}$ is facilitated. Furthermore, when InAlGaAs is grown under the same growth conditions as those for InAlAs, a similar high-resistance layer is produced.

Meanwhile, a method of adding Fe that serves as a deep acceptor to compensate the shallow donor is known. However, in a laser device including such a high-resistance Fe-doped InAlAs layer, Fe atoms in the Fe-doped InAlAs layer are diffused into adjacent semiconductor layers, especially the active layer, and the electrical and optical characteristics of the active layer are degraded, thereby reducing the reliability of the laser device. Contrary to the Fe-doped InAlAs layer, since the high-resistance InAlAs layer 4 in which the shallow donor is compensated by the shallow acceptor comprising carbon does not contain a diffusible impurity, such as Fe, the above-described problem does not occur.

After removal of the SiN film 7 by etching, a p type InP layer 23 and a p type InGaAs contact layer 8 are grown over the entire surface of the structure as shown in FIG. 6(e). Finally, a surface electrode (p side electrode) 5 comprising AuZn/Au is produced on the surface of the p type InGaAs contact layer 8 and a rear electrode (n side electrode) 6 comprising AuGe/Au is produced on the rear surface of the n type InP substrate 100 to complete the semiconductor laser having the high-resistance InAlAs layer 4 at both sides of the ridge structure 30.

In the above-described prior art method of fabricating a semiconductor laser device, when the SiN film 7 is removed after the selective growth of the high-resistance InAlAs layer 4 and the n type InP layer 21, the surface of the high-resistance InAlAs layer 4 that was in contact with the rear surface of the SiN film 7 outside each side of the ridge structure is exposed to the etchant and, after the etching, the surface of the high-resistance layer 4 is exposed to air. Since the high-resistance InAlAs layer 4 contains the easily oxidizable element Al, the surface of the InAlAs layer 4 exposed to air after the removal of the SiN film 7 is easily oxidized, and surface oxide films shown by xxx in FIG. 6(e) are produced. When the p type InP layer 23 and the p type InGaAs contact layer 8 are grown on the surface of the high-resistance InAlAs layer 4, the surface oxide films adversely affect the crystalline quality of these layers. Therefore, it is difficult to grow a semiconductor layer with good crystalline quality on the high-resistance InAlAs layer 4. In addition, as shown in FIG. 6(e), the surface of the grown layer is not even, and the uneven surface causes imperfect ohmic contact between the p type InGaAs contact layer 8 and the surface electrode (p side electrode) 5.

As described above, since the crystalline quality of the regrown InP layer 23 and contact layer 8 and the ohmic contact between the surface electrode 5 and the contact layer 8 are not satisfactory, a semiconductor laser device with satisfactory characteristics cannot be obtained.

SUMMARY OF THE INVENTION

It is an object of the present invention to provide a method of fabricating a semiconductor laser device including a high-resistance InAlAs layer grown by MOCVD at both sides of a ridge structure, which method provides a contact layer comprising a semiconductor of satisfactory crystalline quality and a surface electrode making satisfactory ohmic contact with the contact layer.

Other objects and advantages of the invention will become apparent from the detailed description that follows. The detailed description and specific embodiments described are provided only for illustration since various additions and modifications within the scope of the invention will be apparent to those of skill in the art from the detailed description.

According to a first aspect of the present invention, a method of fabricating a semiconductor device comprises forming a stripe-shaped first insulating film on a semiconductor layer; using the first insulating film as a mask, etching the semiconductor layer to a prescribed depth to form a stripe-shaped ridge structure comprising a portion of the semiconductor layer left under the first insulating film; using the first insulating film as a mask, growing a high-resistance layer comprising InAlAs or InAlGaAs contacting both sides of the ridge structure by MOCVD, the high-resistance layer having a shallow donor concentration $N_{SD}$, a shallow acceptor concentration $N_{SA}$, and a deep donor concentration $N_{DD}$ in relationships of $N_{SA}>N_{SD}$ and $N_{SA}-N_{SD}<N_{DD}$; after removal of the first insulating film, forming a second insulating film covering the entire surface of the high-resistance layer; and forming a surface electrode on the semiconductor layer at the surface of the ridge structure. In this method, since no semiconductor layer is regrown on the high-resistance layer, the above-described problem in the prior art method that the crystalline quality of the semiconductor layer grown on the oxidized surface of the high-resistance layer is degraded is avoided. In addition, since the surface electrode is not produced on the contact layer that is regrown on the oxidized surface of the high-resistance layer as in the prior art method but produced directly on the surface of the ridge, satisfactory ohmic contact between the surface electrode and the semiconductor constituting the ridge is easily obtained, whereby the characteristics of the semiconductor device are improved.

According to a second aspect of the present invention, in the above-described method of fabricating a semiconductor device, the semiconductor layer comprises a semiconductor base layer, and a contact layer disposed on the semiconductor base layer and comprising a semiconductor that makes an ohmic contact with the surface electrode; the ridge structure is fabricated by, using the first insulating film on the contact layer as a mask, anisotropically dry-etching the contact layer and, subsequently, using the first insulating film and a portion of the contact layer left under the insulating film as masks, selectively wet-etching the semiconductor base layer to a prescribed depth to form a stripe-shaped ridge base part comprising a portion of the semiconductor base layer and having both side surfaces positioned within both ends of the contact layer, thereby producing a stripe-shaped ridge structure comprising the contact layer and the ridge base part; and the high-resistance layer is grown so that the surface of the high-resistance layer contacts portions of the rear surface of the contact layer exposed at the both sides of the ridge base part. Therefore, satisfactory ohmic contact is made between the surface electrode and the contact layer. In addition, since the width of the contact layer left under the first insulating film is larger than the width of the ridge base part, the contact area of the contact layer and the surface electrode is increased, whereby the contact resistance is reduced. As a result, the characteristics of the semiconductor device are improved.

According to a third aspect of the present invention, in the above-described method of fabricating a semiconductor device, the semiconductor layer comprises a first conductivity type semiconductor substrate, a first conductivity type semiconductor lower cladding layer having a band gap energy, an undoped semiconductor active layer having a band gap energy smaller than the band gap energy of the lower cladding layer, a second conductivity type, opposite the first conductivity type, semiconductor upper cladding layer having a band gap energy larger than the band gap energy of the active layer, and a second conductivity type semiconductor contact layer, these semiconductor layers being successively grown on the semiconductor substrate; and the etching of the semiconductor layer is carried out until the lower cladding layer or the semiconductor substrate is exposed.

According to a fourth aspect of the present invention, in the above-described method of fabricating a semiconductor device, the semiconductor base layer comprises a first conductivity type semiconductor substrate, a first conductivity type semiconductor lower cladding layer having a band gap energy, an undoped semiconductor active layer having a band gap energy smaller than the band gap energy of the lower cladding layer, and a second conductivity type, opposite the first conductivity type, semiconductor upper cladding layer having a band gap energy larger than the band gap energy of the active layer, these semiconductor layers being successively grown on the semiconductor substrate; the contact layer comprises a second conductivity type semiconductor; and the etching of the semiconductor base layer is carried out until the lower cladding layer or the semiconductor substrate is exposed.

According to a fifth aspect of the present invention, the above-described method of fabricating a semiconductor device further includes forming a pair of insulating films on the semiconductor substrate, sandwiching a first region of the substrate where a semiconductor laser is later fabricated; using the insulating films as masks, selectively growing the lower cladding layer, the active layer, the upper cladding layer, and the contact layer on the first region and on a region including a second region of the substrate, adjacent to the laser region, where a light modulator is later fabricated, these grown semiconductor layers being thicker in the first region than in the second region; forming the stripe-shaped ridge extending over the first region and the second region; forming a first surface electrode for a semiconductor laser and a second surface electrode for a light modulator on the stripe-shaped ridge opposite the first region and the second region, respectively, these electrodes being electrically separated from each other; and after formation of the surface electrodes, forming a rear electrode on the rear surface of the semiconductor substrate, thereby completing an integrated semiconductor laser and light modulator including the continuous active layer in which the active layer included in the semiconductor laser produces laser light and the active layer included in the light modulator absorbs the laser light due to quantum confining Stark effect. Also in this method, since the surface electrodes for the semiconductor laser and the light modulator are in direct contact with the contact layer as the uppermost layer in the ridge, satisfactory ohmic contact is made between the surface electrodes and the contact layer, whereby the characteristics of the semiconductor device are improved.

According to a sixth aspect of the present invention, a method of fabricating a semiconductor device includes forming a stripe-shaped insulating film on a surface of a semiconductor layer; using the insulating film as a mask, anisotropically dry-etching the semiconductor layer to a prescribed depth to form a stripe-shaped ridge comprising a portion of the semiconductor layer left under the insulating film; using the insulating film as a mask, selectively growing a high-resistance layer comprising InAlAs or InAlGaAs contacting both side surfaces of the ridge by MOCVD, the high-resistance layer having a shallow donor concentration $N_{SD}$, a shallow acceptor concentration $N_{SA}$, and a deep donor concentration $N_{DD}$ in relationships of $N_{SA}>N_{SD}$ and $N_{SA}-N_{SD}<N_{DD}$, and subsequently, growing a coating layer over the entire surface of the high-resistance layer, the coating layer comprising a semiconductor that is harder to combine with oxygen than the semiconductor of the high-resistance layer; after removal of the insulating film, growing a contact layer comprising a semiconductor that makes an ohmic contact with a surface electrode that is lately produced, on the ridge and on the coating layer; and producing a surface electrode on the surface of the contact layer. In this method, since the surface of the high-resistance layer is covered with the coating layer, it is not exposed to air and oxidized. Further, since the surface of the coating layer is hardly oxidized, the contact layer grown on the coating layer has satisfactory crystalline quality. Therefore, satisfactory ohmic contact is achieved between the contact layer and the surface electrode, whereby the characteristics of the semiconductor device are improved.

According to a seventh aspect of the present invention, in the above-described method of fabricating a semiconductor device, the ridge structure is produced by anisotropically dry-etching the semiconductor layer to a prescribed depth using the insulating film as a mask and, subsequently, wet-etching the semiconductor layer at the both sides of the ridge so that the both sides of ridge are positioned within the both ends of the insulating film. In this method, it is avoided that the high-resistance layer grown at the both sides of the ridge adheres to the peripheral portion of the surface of the insulating film, exposed to air, and oxidized. Therefore, the crystalline quality of the contact layer is further improved, whereby the ohmic contact between the contact layer and the surface electrode is further improved.

According to an eighth aspect of the present invention, in the above-described method of fabricating a semiconductor device, the semiconductor layer comprises a first conductivity type semiconductor substrate, a first conductivity type semiconductor lower cladding layer having a band gap energy, an undoped semiconductor active layer having a band gap energy smaller than the band gap energy of the lower cladding layer, and a second conductivity type, opposite the first conductivity type, semiconductor upper cladding layer having a band gap energy larger than the band gap energy of the active layer, these semiconductor layers being successively grown on the semiconductor substrate; the contact layer comprises a second conductivity type semiconductor; and the etching of the semiconductor layer is carried out until the lower cladding layer or the semiconductor substrate is exposed.

According to a ninth aspect of the present invention, in the above-described method of fabricating a semiconductor device, the coating layer comprises a first conductivity type lower coating layer grown on the surface of the high-resistance layer and a second conductivity type upper coating layer grown on the lower coating layer. The lower coating layer suppresses injection of carriers from the contact layer into the high-resistance layer. In addition, since the contact layer and the upper coating layer are of the same conductivity type, p-n junction is not produced at the interface between them, so that leakage current at the interface is prevented. Therefore, the characteristics of the semiconductor device are further improved.

According to a tenth aspect of the present invention, the above-described method of fabricating a semiconductor device further includes forming a pair of insulating films on the semiconductor substrate, sandwiching a first region of the substrate where a semiconductor laser is later fabricated; using the insulating films as masks, selectively growing the lower cladding layer, the active layer, and the upper cladding layer, on the first region and on a region including a second region of the substrate, adjacent to the first region, where a light modulator is later fabricated, these grown semiconductor layers being thicker in the first region than in the second region; forming the stripe-shaped ridge extending over the first region and the second region; forming a first surface electrode for a semiconductor laser and a second surface electrode for a light modulator on the stripe-shaped ridge opposite the first region and the second region, respectively, these electrodes being electrically separated from each other; and after formation of the surface electrodes, forming a rear electrode on the rear surface of the semiconductor substrate, thereby completing an integrated semiconductor laser and light modulator including the continuous active layer in which the active layer included in the semiconductor laser produces laser light and the active layer included in the light modulator absorbs the laser light due quantum confining Stark effect. Also in this method, since the surface of the high-resistance layer is covered with the coating layer, it is not exposed to air and oxidized. Further, since the surface of the coating layer is hardly oxidized, the contact layer grown on the coating layer has satisfactory crystalline quality. Therefore, satisfactory ohmic contact is achieved between the contact layer and the first and second surface electrodes, whereby the characteristics of the semiconductor device are improved.

According to an eleventh aspect of the present invention, a method of fabricating a semiconductor device includes growing a cap layer on a semiconductor base layer, the cap layer comprising a semiconductor different from the semiconductor of the base layer; forming a stripe-shaped insulating film on the cap layer; using the insulating film as a mask, anisotropically dry-etching the cap layer and, subsequently, using the insulating film and the cap layer left under the insulating film as masks, selectively wet-etching the semiconductor base layer to form a stripe-shaped ridge base part comprising a portion of the semiconductor base layer and having both side surfaces positioned within both ends of the cap layer, thereby producing a stripe-shaped ridge structure comprising the cap layer and the ridge base part; using the insulating film as a mask, growing a high-resistance layer comprising InAlAs or InAlGaAs by MOCVD, contacting the both side surfaces of the ridge base part and contacting portions of the rear surface of the cap layer exposed at the both sides of the ridge base part, the high-resistance layer having a shallow donor concentration $N_{SD}$, a shallow acceptor concentration $N_{SA}$, and a deep donor concentration $N_{DD}$ in relationships of $N_{SA}>N_{SD}$ and $N_{SA}-N_{SD}<N_{DD}$, and subsequently, growing a coating layer over the entire surface of the high-resistance layer, the coating layer comprising a semiconductor that is harder to combine with oxygen than the semiconductor of the high-resistance layer; after removal of the insulating film, growing a contact layer comprising a semiconductor that makes an ohmic contact with a surface electrode that is lately produced, on the ridge and on the coating layer; and producing a surface electrode on the surface of the contact layer. In this method, since the surface of the high-resistance layer is covered with the coating layer and the cap layer, it is not exposed to air and oxidized. Further, since the coating layer and the cap layer are hardly oxidized, the contact layer grown on the coating layer and the cap layer has satisfactory crystalline quality. Therefore, satisfactory ohmic contact is achieved between the contact layer and the surface electrode, whereby the characteristics of the semiconductor device are improved.

According to a twelfth aspect of the present invention, in the above-described method of fabricating a semiconductor device, the semiconductor base layer comprises a first conductivity type semiconductor substrate, a first conductivity type semiconductor lower cladding layer having a band gap energy, an undoped semiconductor active layer having a band gap energy smaller than the band gap energy of the lower cladding layer, and a second conductivity type, opposite the first conductivity type, semiconductor upper cladding layer having a band gap energy larger than the band gap energy of the active layer, these semiconductor base layers being successively grown on the semiconductor substrate; the contact layer comprises a second conductivity type semiconductor; the cap layer comprises a second conductivity type semiconductor; and the semiconductor base layer is etched until the lower cladding layer or the semiconductor substrate is exposed.

According to a thirteenth aspect of the present invention, in the above-described method of fabricating a semiconductor device, the coating layer comprises a first conductivity type lower coating layer grown on the surface of the high-resistance layer and a second conductivity type upper coating layer grown on the lower coating layer. The lower coating layer suppresses injection of carriers from the contact layer into the high-resistance layer. In addition, since the contact layer and the upper coating layer are of the same conductivity type, p-n junction is not produced at the interface between them, so that leakage current at the interface is prevented. Therefore, the characteristics of the semiconductor device are further improved.

According to a fourteenth aspect of the present invention, the above-described method of fabricating a semiconductor device further includes forming a pair of insulating films on the semiconductor substrate, sandwiching a first region of the substrate where a semiconductor laser is later fabricated; using the insulating films as masks, selectively growing the lower cladding layer, the active layer, the upper cladding layer, and the cap layer on the first region and on a region including a second region of the substrate, adjacent to the first region, where a light modulator is later fabricated, these grown semiconductor layers being thicker in the first region than in the second region; forming the stripe-shaped ridge extending over the first region and the second region; forming a first surface electrode for a semiconductor laser and a second surface electrode for a light modulator on the stripe-shaped ridge opposite the first region and the second region, respectively, these electrodes being electrically separated from each other; and after formation of the surface electrodes, forming a rear electrode on the rear surface of the semiconductor substrate, thereby completing an integrated semiconductor laser and light modulator including the continuous active layer in which the active layer included in the semiconductor laser produces laser light and the active layer included in the light modulator absorbs the laser light due to quantum confining Stark effect. Also in this method, since the surface of the high-resistance layer is covered with the coating layer and the cap layer, it is not exposed to air and oxidized. Further, since the coating layer and the cap layer are hardly oxidized, the contact layer grown on the coating layer and the cap layer has satisfactory crystalline quality. Therefore, satisfactory ohmic contact is achieved between the contact layer and the first and second surface electrodes, whereby the characteristics of the semiconductor device are improved.

According to a fifteenth aspect of the present invention, a semiconductor device is fabricated by the process comprising forming a stripe-shaped first insulating film on a semiconductor layer; using the first insulating film as a mask, etching the semiconductor layer to a prescribed depth to form a stripe-shaped ridge structure comprising a portion of the semiconductor layer left under the first insulating film; using the first insulating film as a mask, growing a high-resistance layer comprising InAlAs or InAlGaAs contacting both sides of the ridge structure by MOCVD, the high-resistance layer having a shallow donor concentration $N_{SD}$, a shallow acceptor concentration $N_{SA}$, and a deep donor concentration $N_{DD}$ in relationships of $N_{SA} > N_{SD}$ and $N_{SA} - N_{SD} < N_{DD}$; after removal of the first insulating film, forming a second insulating film covering the entire surface of the high-resistance layer; and forming a surface electrode on the semiconductor layer at the surface of the ridge structure and a rear electrode on the rear surface of the semiconductor layer. Since no semiconductor layer is regrown on the high-resistance layer, the above-described problem in the prior art method that the crystalline quality of the semiconductor layer grown on the oxidized surface of the high-resistance layer is degraded is avoided. In addition, since the surface electrode is not produced on the contact layer that is regrown on the oxidized surface of the high-resistance layer but produced directly on the surface of the ridge, satisfactory ohmic contact between the surface electrode and the semiconductor constituting the ridge is easily obtained, whereby the characteristics of the semiconductor device are improved.

According to a sixteenth aspect of the present invention, in the above-described semiconductor device, the semiconductor layer comprises a first conductivity type semiconductor substrate, a first conductivity type semiconductor lower cladding layer having a band gap energy, an undoped semiconductor active layer comprising a single or multiple quantum well structure in which the well layer comprises a semiconductor having a band gap energy smaller than the band gap energy of the lower cladding layer, a second conductivity type, opposite the first conductivity type, semiconductor upper cladding layer having a band gap energy larger than the band gap energy of the well layer, and a second conductivity type semiconductor contact layer, and these layers are successively and selectively grown on a first region of the substrate where a semiconductor laser is fabricated (hereinafter referred to as laser region) and on a second region of the substrate, adjacent to the first region, where a light modulator is fabricated (hereinafter referred to as modulator region), with the laser region being put between a pair of insulating masks; these grown semiconductor layers are thicker in the laser region than in the modulator region; the stripe-shaped ridge is formed extending over the laser region and the modulator region; the active layer in the laser region produces laser light; the active layer in the modulator region absorbs the laser light due to quantum confining Stark effect; the surface electrode comprises a first surface electrode for a semiconductor laser and a second surface electrode for a light modulator which are produced on the stripe-shaped ridge opposite the laser region and the modulator region, respectively, these electrodes being electrically separated from each other; a rear electrode is produced on the rear surface of the semiconductor substrate over the laser region and the modulator region; a semiconductor laser is fabricated on the laser region and a light modulator is fabricated on the modulator region, and the active layer is continuous over the laser device and the light modulator. Since the surface electrodes of the laser device and the light modulator are in direct contact with the contact layer as the uppermost layer in the ridge, satisfactory ohmic contact is made between the surface electrodes and the contact layer, whereby the characteristics of the semiconductor device are improved.

According to a seventeenth aspect of the present invention, in the above-described semiconductor device, the semiconductor layer comprises a semiconductor base layer, and a contact layer disposed on the semiconductor base layer and comprising a semiconductor that makes an ohmic contact with the surface electrode; the ridge structure comprises a portion of the contact layer and a ridge base part, and the ridge structure is fabricated by the process comprising forming the stripe-shaped first insulating film on the semiconductor contact layer, using the first insulating film as a mask, anisotropically dry-etching the contact layer and, subsequently, using the first insulating film and a portion of the contact layer left under the insulating film as masks, selectively wet-etching the semiconductor base layer to a prescribed depth to form the ridge base part comprising a portion of the semiconductor base layer and having both side surfaces positioned within both ends of the contact layer; and the high-resistance layer is selectively grown so that the surface of the high-resistance layer contacts portions of the rear surface of the contact layer exposed at the both sides of the ridge base part. Therefore, satisfactory ohmic contact is made between the surface electrode and the contact layer. In addition, since the width of the contact layer left under the first insulating film is larger than the width of the ridge base part, the contact area of the contact layer and the surface electrode is increased, whereby the contact resistance is reduced. As a result, the characteristics of the semiconductor device are improved.

According to an eighteenth aspect of the present invention, in the above-described semiconductor device, the semiconductor base layer comprising a first conductivity type semiconductor substrate, a first conductivity type semiconductor lower cladding layer having a band gap energy, an undoped semiconductor active layer comprising a single or multiple quantum well structure in which the well layer comprises a semiconductor having a band gap energy smaller than the band gap energy of the lower cladding layer, and a second conductivity type, opposite the first conductivity type, semiconductor upper cladding layer having a band gap energy larger than the band gap energy of the well layer, and these layers are successively and selectively grown on a first region of the substrate where a semiconductor laser is fabricated (hereinafter referred to as laser region) and on a second region of the substrate, adjacent to the laser region, where a light modulator is fabricated (hereinafter referred to as modulator region), with the laser region being put between a pair of insulating masks; the contact layer comprises a second conductivity type semiconductor that is grown subsequently to the upper cladding layer; the lower cladding layer, active layer, upper cladding layer, and the contact layer are thicker in the laser region than in the modulator region; the stripe-shaped ridge is formed extending over the laser region and the second modulator region; the active layer in the laser region produces laser light; the active layer in the modulator region absorbs the laser light due to quantum confining Stark effect; the surface electrode comprises a first surface electrode for a semiconductor laser and a second surface electrode for a light modulator disposed on the stripe-shaped ridge opposite the laser region and the modulator region, respectively, these electrodes being electrically separated from each other; a rear electrode is disposed on the rear surface of the semiconductor substrate over the laser region and the modulator region; a semiconductor laser is fabricated on the laser region and a light modulator is fabricated on the modulator region; and the active layer is continuous over the semiconductor laser and the light modulator. Also in this device, since the surface electrodes of the semiconductor laser and the light modulator are in direct contact with the contact layer as the uppermost layer in the ridge, satisfactory ohmic contact is made between the surface electrodes and the contact layer. In addition, since the width of the contact layer left under the first insulating film is larger than the width of the ridge base part, the contact area of the contact layer and the surface electrode is increased, whereby the contact resistance is reduced. As a result, the characteristics of the semiconductor device are improved.

According to a nineteenth aspect of the present invention, a semiconductor device is fabricated by the process comprising forming a stripe-shaped insulating film on a surface of a semiconductor layer; using the insulating film as a mask, anisotropically dry-etching the semiconductor layer to a prescribed depth to form a stripe-shaped ridge comprising a portion of the semiconductor layer left under the insulating film; using the insulating film as a mask, selectively growing a high-resistance layer comprising InAlAs or InAlGaAs contacting both side surfaces of the ridge by MOCVD, the high-resistance layer having a shallow donor concentration $N_{SD}$, a shallow acceptor concentration $N_{SA}$, and a deep donor concentration $N_{DD}$ in relationships of $N_{SA} > N_{SD}$ and $N_{SA} - N_{SD} < N_{DD}$, and subsequently, growing a coating layer over the entire surface of the high-resistance layer, the coating layer comprising a semiconductor that is harder to combine with oxygen than the semiconductor of the high-resistance layer; after removal of the insulating film, growing a contact layer comprising a semiconductor that makes an ohmic contact with a surface electrode that is lately produced, on the ridge and on the coating layer; and producing a surface electrode on the surface of the contact layer and a rear electrode on the rear surface of the semiconductor layer. In this device, since the surface of the high-resistance layer is covered with the coating layer, it is not exposed to air and oxidized. Further, since the surface of the coating layer is hardly oxidized, the contact layer grown on the coating layer has satisfactory crystalline quality. Therefore, satisfactory ohmic contact is achieved between the contact layer and the surface electrode, whereby the characteristics of the semiconductor device are improved.

According to a twentieth aspect of the present invention, in the above-described semiconductor device, the semiconductor layer comprises a first conductivity type semiconductor substrate, a first conductivity type semiconductor lower cladding layer having a band gap energy, an undoped semiconductor active layer comprising a single or multiple quantum well structure in which the well layer comprises a semiconductor having a band gap energy smaller than the band gap energy of the lower cladding layer, and a second conductivity type, opposite the first conductivity type, semiconductor upper cladding layer having a band gap energy larger than the band gap energy of the well layer, and these layers are successively and selectively grown on a first region of the substrate where a semiconductor laser is fabricated (hereinafter referred to as laser region) and on a second region of the substrate, adjacent to the laser region, where a light modulator is fabricated (hereinafter referred to as modulator region), with the laser region being put between a pair of insulating masks; these grown semiconductor layers being thicker in the laser region than in the modulator region; the stripe-shaped ridge extending over the laser region and the modulator region; the active layer in the laser region produces laser light; the active layer in the modulator region absorbs the laser light due to quantum confining Stark effect; the surface electrode comprises a first surface electrode for a semiconductor laser and a second surface electrode for a light modulator disposed on the stripe-shaped ridge opposite the laser region and the modulator region, respectively, these electrodes being electrically separated from each other; a rear electrode is disposed on the rear surface of the semiconductor substrate over the laser region and the modulator region; a semiconductor laser is fabricated on the laser region and a light modulator is fabricated on the modulator region; and the active layer is continuous over the semiconductor laser and the light modulator. Also in this device, since the surface of the high-resistance layer is covered with the coating layer, it is not exposed to air and oxidized. Further, since the surface of the coating layer is hardly oxidized, the contact layer grown on the coating layer has satisfactory crystalline quality. Therefore, satisfactory ohmic contact is achieved between the contact layer and the first and second surface electrodes, whereby the characteristics of the semiconductor device are improved.

According to a twenty-first aspect of the present invention, a semiconductor device is fabricated by the process comprising growing a cap layer on a semiconductor base layer, the cap layer comprising a semiconductor different from the semiconductor of the base layer; forming a stripe-shaped insulating film on the cap layer; using the insulating film as a mask, anisotropically dry-etching the cap layer and, subsequently, using the insulating film and the cap layer left under the insulating film as masks, selectively wet-etching the semiconductor base layer to form a stripe-shaped ridge base part comprising a portion of the semiconductor base layer and having both side surfaces positioned within both ends of the cap layer, thereby forming a stripe-shaped ridge structure comprising the cap layer and the ridge base part; using the insulating film as a mask, growing a high-resistance layer comprising InAlAs or InAlGaAs by MOCVD, contacting the both side surfaces of the ridge base part and contacting portions of the rear surface of the cap layer exposed at the both sides of the ridge base part, the high-resistance layer having a shallow donor concentration $N_{SD}$, a shallow acceptor concentration $N_{SA}$, and a deep donor concentration $N_{DD}$ in relationships of $N_{SA} > N_{SD}$ and $N_{SA} - N_{SD} < N_{DD}$, and subsequently, growing a coating layer over the entire surface of the high-resistance layer, the coating layer comprising a semiconductor that is harder to combine with oxygen than the semiconductor of the high-resistance layer; after removal of the insulating film, growing a contact layer comprising a semiconductor that makes an ohmic contact with a surface electrode that is lately produced, on the ridge and on the coating layer; and producing a surface electrode on the surface of the contact layer and a rear electrode on the rear surface of the semiconductor base layer. In this device, since the surface of the high-resistance layer is covered with the coating layer and the cap layer, it is not exposed to air and oxidized. Further, since the coating layer and the cap layer are hardly oxidized, the contact layer grown on the coating layer and the cap layer has satisfactory crystalline quality. Therefore, satisfactory ohmic contact is achieved between the contact layer and the surface electrode, whereby the characteristics of the semiconductor device are improved.

According to a twenty-second aspect of the present invention, in the above-described semiconductor device, the semiconductor base layer comprises a first conductivity type semiconductor substrate, a first conductivity type semiconductor lower cladding layer having a band gap energy, an undoped semiconductor active layer comprising a single or multiple quantum well structure in which the well layer comprises a semiconductor having a band gap energy smaller than the band gap energy of the lower cladding layer, and a second conductivity type, opposite the first conductivity type, semiconductor upper cladding layer having a band gap energy larger than the band gap energy of the well layer, and these layers are successively and selectively grown on a first region of the substrate where a semiconductor laser is fabricated (hereinafter referred to as laser region) and on a second region of the substrate, adjacent to the laser region, where a light modulator is fabricated (hereinafter referred to as modulator region), with the laser region being put between a pair of insulating masks; the cap layer comprising a second conductivity type semiconductor that is grown subsequently to the upper cladding layer; the lower cladding layer, active layer, upper cladding layer, and cap layer are thicker in the laser region than in the modulator region; the stripe-shaped ridge is formed extending over the laser region and the modulator region; the active layer in the laser region produces laser light; the active layer in the modulator region absorbs the laser light due to quantum confining Stark effect; the surface electrode comprises a first surface electrode for a semiconductor laser and a second surface electrode for a light modulator which are disposed on the stripe-shaped ridge opposite the laser region and the modulator region, respectively, these electrodes being electrically separated from each other; a rear electrode is formed on the rear surface of the semiconductor substrate over the laser region and the modulator region; a semiconductor laser device is fabricated on the laser region of the substrate and a light modulator is fabricated on the modulator region of the substrate; and the active layer is continuous over the laser device and the light modulator. Also in this device, since the surface of the high-resistance layer is covered with the coating layer and the cap layer, it is not exposed to air and oxidized. Further, since the coating layer and the cap layer are hardly oxidized, the contact layer grown on the coating layer and the cap layer has satisfactory crystalline quality. Therefore, satisfactory ohmic contact is achieved between the contact layer and the first and second surface electrodes, whereby the characteristics of the semiconductor device are improved.

BRIEF DESCRIPTION OF THE DRAWINGS

FIGS. 2(a)–2(e) are sectional views illustrating process steps in a method of fabricating a semiconductor laser device according to a second embodiment of the present invention.

FIGS. 5(a)–5(c) are diagrams for explaining a method of fabricating an integrated semiconductor laser and light modulator according to a fifth embodiment of the present invention, wherein FIG. 5(a) is a plan view showing a process step in the fabricating method, FIG. 5(b) is a sectional view showing a completed device, and FIG. 5(c) is a sectional view taken along a line 5c—5c in FIG. 5(b).

DETAILED DESCRIPTION OF THE PREFERRED EMBODIMENTS

[Embodiment 1]

Figure 1:
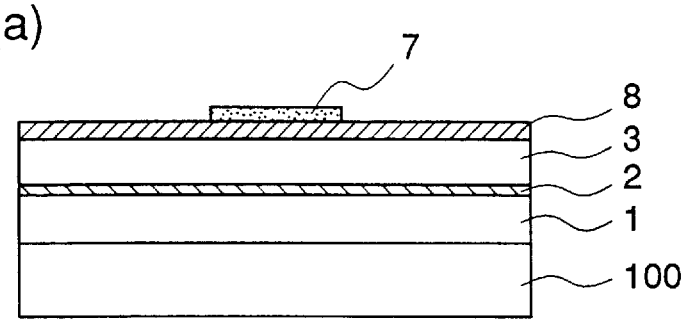
FIGS. 1(a)–1(d) are sectional views illustrating process steps in a method of fabricating a semiconductor laser device according to a first embodiment of the present invention.
Figure 1:
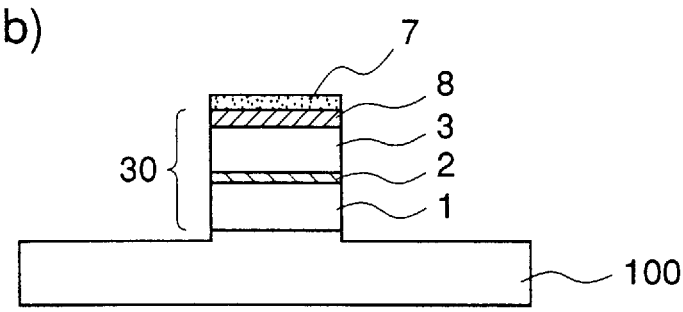
Figure 1:
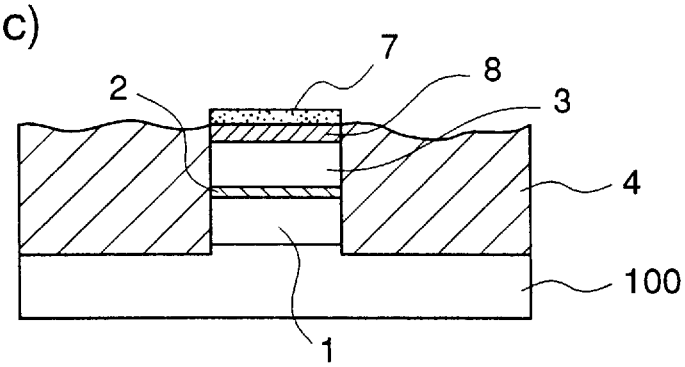
Figure 1:
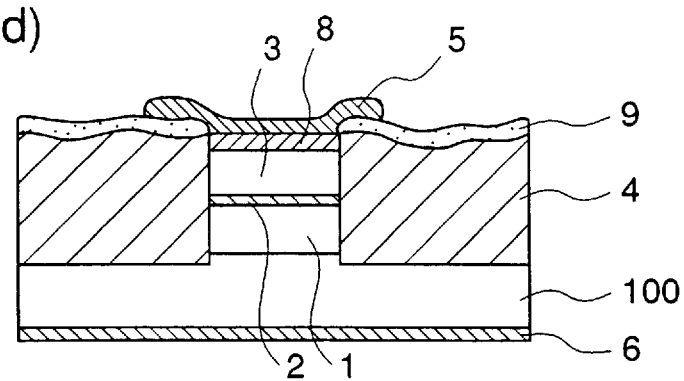

FIGS. 1(a)–1(d) are sectional views illustrating process steps in a method of fabricating a semiconductor laser device including a high-resistance InAlAs layer grown by MOCVD at both sides of a ridge structure, and a semiconductor laser device fabricated by the method (FIG. 1(d)), according to a first embodiment of the present invention. In these figures, reference numeral 1 designates an n type InP lower cladding layer, numeral 2 designates an InGaAsP active layer, numeral 3 designates a p type InP upper cladding layer, numeral 4 designates a high-resistance InAlAs layer, numeral 5 designates a surface electrode, i.e., a p side electrode, comprising AuZn/Au, numeral 6 designates a rear electrode, i.e., an n side electrode, comprising AuGe/Au, numeral 7 designates a first insulating film comprising SiN, numeral 8 designates a p type InGaAs contact layer, numeral 9 designates a second insulating film comprising $SiO_2$, numeral 30 designates a ridge structure, and numeral 100 designates an n type InP substrate.

Initially, there are successively grown over the n type InP substrate 100, an n type InP lower cladding layer 1 having a thickness of several microns and a dopant concentration of $1 \times 10^{18}$ cm$^{-3}$, an undoped InGaAsP active layer 2 having a thickness of 10–100 nm, a p type InP upper cladding layer 3 having a thickness of 1 μm and a dopant concentration of $5 \times 10^{17}$–$1 \times 10^{18}$ cm$^{-3}$, and a p type InGaAs contact layer 8 having a thickness of 0.1 μm and a dopant concentration of $1 \times 10^{18}$ cm$^{-3}$. These layers are grown by MOCVD, and S (sulfur) and Zn (zinc) are employed as an n type dopant and a p type dopant, respectively. The composition of InGaAsP for the active layer 2 is selected so that the emission wavelength is in a range of 1.3–1.6 μm and the lattice constant is approximately equal to the lattice constant of InP. Although the active layer 2 comprises a single InGaAsP layer of uniform composition, it may comprise a single or multiple quantum well structure. In this case, InGaAsP is used for the well layer, and InGaAsP, InGaP, or InP is used for the barrier layer. The InGaAs contact layer 8 has a composition that lattice-matches with InP.

Next, an SiN film 100–200 nm thick is deposited over the entire surface of the p type InGaAs contact layer 8 and patterned by photolithography and etching to produce a stripe-shaped SiN film (first insulating film) 7 as shown in FIG. 1(a). The stripe direction is perpendicular to the cross-section of the figure.

Thereafter, as illustrated in FIG. 1(b), using the stripe-shaped SiN film 7 as a mask, the semiconductor layers on the InP substrate are etched by anisotropic dry etching, such as reactive ion etching (RIE), thereby forming a ridge structure 30 comprising portions of the semiconductor layers left beneath the SiN film 7. The etching depth is about 4 μm. As an etching gas, a mixture of $C_2H_6$ and $H_2$ is employed. As a result of the anisotropic etching, the width of the SiN film 7 is approximately equal to the width of the ridge structure 30.

In the step of FIG. 1(c), using the SiN film 7 as a mask, a high-resistance InAlAs layer 4 is selectively grown by MOCVD so as to fill the spaces at both sides of the ridge structure 30, formed by the dry etching of the semiconductor layers. The high-resistance InAlAs layer 4 serves as a current blocking layer for concentrating current in the ridge structure 30. During the MOCVD, the InAlAs layer 4 does not grow on the SiN film 7.

As described above, since the high-resistance InAlAs layer 4 is grown at about 500° C., lower than the ordinary growth temperature of 600°–700° C., the concentration of carbon (C) that is incorporated into the growing layer and serves as a shallow acceptor is increased. The shallow donor comprising residual impurities, such as Si, is compensated by the shallow acceptor. The shallow acceptor having a concentration higher than the concentration of the shallow donor is compensated by the deep donor, whereby a high resistivity exceeding $5 \times 10^4$ Ω·cm, is obtained. That is, in the high-resistance InAlAs layer, the shallow donor concentration $N_{SD}$, the shallow acceptor concentration $N_{SA}$, and the deep donor concentration $N_{DD}$ have relationships of $N_{SA} > N_{SD}$ and $N_{SA} - N_{SD} < N_{DD}$. In this high-resistance InAlAs layer, since an impurity that is diffusible and serves as deep acceptor, such as Fe, is not used for compensating the shallow donor, degradation in laser characteristics due to Fe diffusion into the active layer is avoided. As a result, a highly reliable semiconductor laser device is realized.

After removal of the SiN film 7, an $SiO_2$ film 9 (second insulating film) is formed on the surface of the high-resistance InAlAs layer 4. Thereafter, as illustrated in FIG. 1(d), a surface electrode (p side electrode) 5 comprising AuZn(100–200 nm)/Au(2 μm) is formed on a region including the surface of the p type InGaAs contact layer 8, and a rear electrode (n side electrode) 6 comprising AuGe (100–200 nm)/Au(1 μm) is formed on the rear surface of the InP substrate 100. The Au layers of the surface electrode 5 and the rear electrode 6 are produced by electroplating.

As a result, a semiconductor laser device shown in FIG. 1(d) in which the high-resistance InAlAs layer 4 is grown by MOCVD on both sides of the ridge structure 30 comprising the lower cladding layer 1, the active layer 2, the upper cladding layer 3, and the contact layer 8, and the surface electrode 5 contacting the contact layer 8 is fabricated.

In this first embodiment of the invention, after the selective growth of the high-resistance InAlAs layer 4, when the SiN film 7 is removed, the surfaces of the high-resistance InAlAs layer 4 are exposed to air and oxidized. However, in contrast to the prior art method, since no semiconductor layer, such as a contact layer, is regrown on the oxidized surface of the high-resistance InAlAs layer 4, unwanted degradation in crystalline quality of the regrown layer is avoided.

Further, in this first embodiment of the invention, the surface electrode 5 contacts the p type InGaAs contact layer 8 but does not contact the high-resistance InAlAs layer 4 because the $SiO_2$ film 9 is interposed between the electrode 5 and the high-resistance layer 4. Since the InGaAs contact layer 8 does not include oxidizable elements, such as Al, the surface of the contact layer 8 is not oxidized after removal of the SiN film 7. Therefore, a satisfactory ohmic contact between the contact layer 8 and the surface electrode 5 is realized. As a result, electrical characteristics of the semiconductor laser device are significantly improved.

The dopant impurity contained in the high-resistance InAlAs layer 4 and serving as a shallow acceptor is not restricted to carbon. For example, beryllium or magnesium may be used. When oxygen serving as deep donor is included, the deep donor concentration $N_{DD}$ is increased and the range of the shallow acceptor concentration $N_{SA}$ that satisfies $N_{SA}-N_{SD}<N_{DD}$ is increased, whereby control of $N_{SA}$ is facilitated.

Furthermore, when InAlGaAs is grown under the same growth conditions as those for InAlAs, a similar high-resistance layer is produced.

[Embodiment 2]

FIGS. 2(a)–2(e) are sectional views illustrating process steps in a method of fabricating a semiconductor laser device including a high-resistance InAlAs layer grown by MOCVD on both sides of a ridge structure and a completed semiconductor laser device (FIG. 2(e)) according to a second embodiment of the present invention. In the figure, the same reference numerals as in FIGS. 1(a)–1(d) designate the same or corresponding parts. Reference numeral 301 designates a base of the ridge structure 30.

Initially, as in the first embodiment of the invention, there are successively grown on the entire surface of the n type InP substrate 100, an n type InP lower cladding layer 1 having a thickness of several microns and a dopant concentration of $1\times10^{18}$ cm$^{-3}$, an undoped InGaAsP active layer 2 having a thickness of 10–100 nm, a p type InP upper cladding layer 3 having a thickness of 1 $\mu$m and a dopant concentration of $5\times10^{17}$–$1\times10^{18}$ cm$^{-3}$, and a p type InGaAs contact layer 8 having a thickness of 0.1 $\mu$m and a dopant concentration of $1\times10^{18}$ cm$^{-3}$. These layers are grown by MOCVD. The composition of InGaAsP for the active layer 2 is selected so that the emission wavelength is in a range of 1.3–1.6 $\mu$m and the lattice constant is approximately equal to the lattice constant of InP. The active structure 2 may comprise a quantum well layer as described in the first embodiment. Next, an SiN film 100–200 nm thick is deposited over the entire surface of the p type InGaAs contact layer 8 and patterned by photolithography and etching to form a stripe-shaped SiN film (first insulating film) 7 as shown in FIG. 2(a). The stripe direction is perpendicular to the cross-section of the figure.

Thereafter, as illustrated in FIG. 2(b), using the SiN film 7 as a mask, the p type InGaAs contact layer 8 is selectively etching by anisotropic dry etching, such as RIE.

In the step of FIG. 2(c), using the SiN film 7 and the InGaAs contact layer 8 under the SiN film 7 as masks, the InP upper cladding layer 3, the InGaAsP active layer 2, and the InP lower cladding layer 1 are selectively wet-etched to form a ridge base 301 comprising portions of the semiconductor layers under the InGaAs contact layer 8. The etching depth is about 4 $\mu$m. Preferably, an HCL based etchant is employed. Since this wet etching is isotropic etching, the etching proceeds not only perpendicular direction to the surface of the substrate but also parallel to the surface, so that the width of the ridge base 301 is narrower than the width of the SiN film 7, i.e., the width of the InGaAs contact layer 8.

In the step of FIG. 2(d), using the SiN film 7 as a mask, a high-resistance InAlAs layer 4 is selectively grown by MOCVD so as to fill the spaces at both sides of the ridge base 30, formed by the wet etching of the semiconductor layers. The high-resistance InAlAs layer 4 serves as a current blocking layer for concentrating current in the ridge structure 30. During the MOCVD, the InAlAs layer 4 does not grow on the SiN film 7.

As described above, the high-resistance InAlAs layer 4 is grown at a relatively low temperature about 500° C., and the concentration of the shallow donor $N_{SD}$, the concentration of the shallow acceptor $N_{SA}$ which comprises mainly carbon, and the concentration of the deep donor $N_{DD}$ have relationships of $N_{SA}>N_{SD}$ and $N_{SA}-N_{SD}<N_{DD}$, whereby a high resistivity, exceeding $5\times10^4$ $\Omega\cdot$cm, is realized. Further, as a result of the low growth temperature, the high-resistance layer 4 adheres closely to the rear surface of the InGaAs contact layer 8 exposed at both sides of the ridge base 301.

After removal of the SiN film 7, an SiO$_2$ film 9 (second insulating film) is formed on the surface of the high-resistance InAlAs layer 4. Thereafter, as illustrated in FIG. 2(e), a surface electrode (p side electrode) 5 comprising AuZn(100–200 nm)/Au(2 $\mu$m) is formed on a region including the surface of the p type InGaAs contact layer 8, and a rear electrode (n side electrode) 6 comprising AuGe (100–200 nm)/Au(1 $\mu$m) is formed on the rear surface of the InP substrate 100. The Au layers of the surface electrode 5 and the rear electrode 6 are produced by electroplating.

As a result, the semiconductor laser device shown in FIG. 2(e) in which the high-resistance InAlAs layer 4 is grown by MOCVD on both sides of the ridge base 301 comprising the lower cladding layer 1, the active layer 2, and the upper cladding layer 3, and the surface electrode 5 contacts the contact layer 8 is fabricated.

Also in this second embodiment of the invention, when the SiN film 7 is removed, the surface of the high-resistance InAlAs layer 4 are exposed to air and oxidized. However, since no semiconductor layer, such as a contact layer, is regrown on the oxidized surface of the high-resistance InAlAs layer 4, unwanted degradation in crystalline quality of the regrown layer is avoided. Further, the surface electrode 5 contacts the p type InGaAs contact layer 8 but does not contact the high-resistance InAlAs layer 4 because the SiO$_2$ film 9 is interposed between the electrode 5 and the high-resistance layer 4. Since the InGaAs contact layer 8 does not include oxidizable elements, such as Al, the surface of the contact layer 8 is not oxidized after removal of the SiN film 7. Therefore, a satisfactory ohmic contact between the contact layer 8 and the surface electrode 5 is realized. As a result, electrical characteristics of the semiconductor laser device are significantly improved.

Furthermore, in this second embodiment of the invention, the width of the p type InGaAs contact layer 8 can be larger than the width of the ridge base 301 that is determined by desired performance of the semiconductor laser device, whereby the contact area of the contact layer 8 and the surface electrode 5 is increased and the contact resistance is reduced. As a result, the characteristics of the semiconductor laser device are further improved.

The dopant impurity contained in the high-resistance InAlAs layer 4 and serving as a shallow acceptor is not restricted to carbon. For example, beryllium or magnesium may be used. When oxygen serving as deep donor is included, the deep donor concentration $N_{DD}$ is increased and the range of the shallow acceptor concentration $N_{SA}$ that satisfies $N_{SA}-N_{SD}<N_{DD}$ is increased, whereby control of $N_{SA}$ is facilitated.

Furthermore, when InAlGaAs is grown under the same growth conditions as those for InAlAs, a similar high-resistance layer is produced.

[Embodiment 3]

Figure 3:
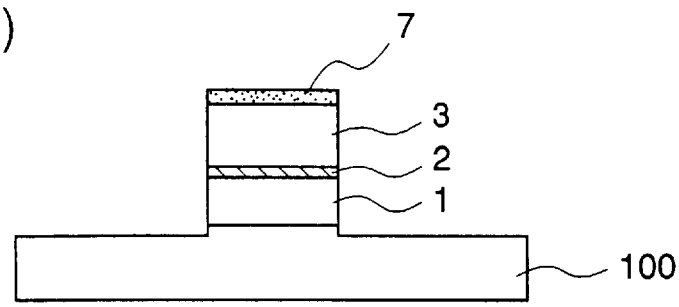
FIGS. 3(a)–3(d) are sectional views illustrating process steps in a method of fabricating a semiconductor laser device according to a third embodiment of the present invention.
Figure 3:
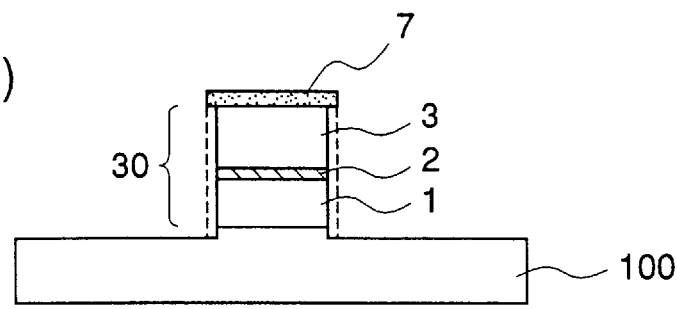
Figure 3:
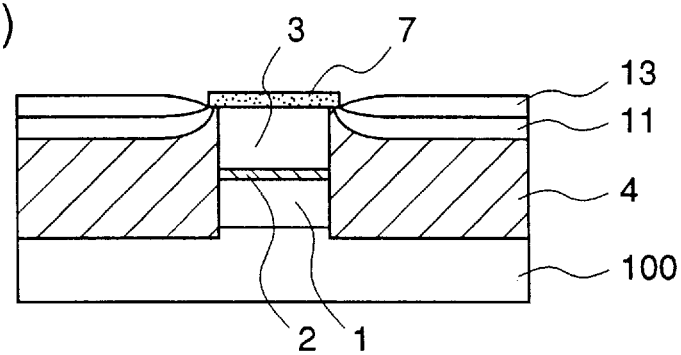
Figure 3:
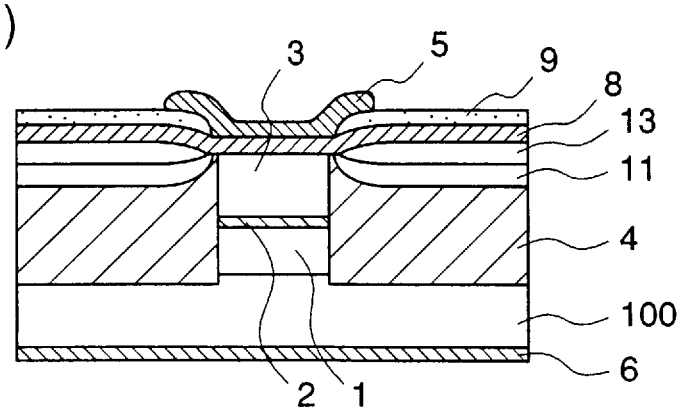

FIGS. 3(a)–3(d) are sectional views illustrating process steps in a method of fabricating a semiconductor laser device including a high-resistance InAlAs layer grown by MOCVD on both sides of a ridge structure and a completed semiconductor laser device (FIG. 3(d)) according to a third embodiment of the present invention. In the figures, the same reference numerals as in FIGS. 1(a)–1(d) and 2(a)–2(e) designate the same or corresponding parts. Reference numerals 11 and 13 designate an n type InP lower coating layer and a p type InP upper coating layer, respectively.

A description is given of the fabricating method.

Initially, there are successively grown over the entire surface of the n type InP substrate 100, an n type InP lower cladding layer 1 having a thickness of several microns and a dopant concentration of $1\times10^{18}$ cm$^{-3}$, an undoped InGaAsP active layer 2 having a thickness of 10–100 nm, and a p type InP upper cladding layer 3 having a thickness of 1 $\mu$m and a dopant concentration of $5\times10^{17}$–$1\times10^{18}$ cm$^{-3}$. These layers are grown by MOCVD. The composition of InGaAsP for the active layer 2 is selected so that the emission wavelength is in a range of 1.3–1.6 $\mu$m and the lattice constant is approximately equal to the lattice constant of InP. The active structure 2 may comprise a quantum well layer as described in the first embodiment. Next, an SiN film 100–200 nm thick is deposited over the entire surface of the p type InP upper cladding layer 3 and patterned by photolithography and etching to form a stripe-shaped SiN film (first insulating film) 7 as shown in FIG. 2(a). The stripe direction is perpendicular to the cross-section of the figure.

Thereafter, as illustrated in FIG. 3(a), using the SiN film 7 as a mask, the semiconductor layers on the InP substrate are etched by anisotropic dry-etching, such as RIE. The etching depth is about 4 $\mu$m. As a result of the anisotropic etching, the width of the SiN film 7 is approximately equal to the width of the semiconductor layers under the SiN film 7.

Using the SiN film 7 as a mask, the semiconductor layers 1 to 3 are slightly wet etched at both sides in a thickness not exceeding 0.1 $\mu$m at each side. Since the wet etching is isotropic etching, the both sides of the semiconductor layers under the SiN film 7 recede from both ends of the SiN film 7 by the thickness of the etched portion. As a result of the etching, a ridge structure 30 comprising the semiconductor layers 1 to 3 is fabricated.

In this step of FIG. 3(c), using the SiN film 7 as a mask, a high-resistance InAlAs layer 4, an n type InP lower coating layer 11, and a p type InP upper coating layer 13 are successively grown by MOCVD so as to fill the spaces at both sides of the ridge 30, formed by the etching of the semiconductor layers. The high-resistance layer 4 and the lower and upper coating layers 11 and 13 are not grown on the SiN film 7. The high-resistance InAlAs layer 4 serves as a current blocking layer for concentrating current in the ridge 30. Further, the InP lower and upper coating layers 11 and 13 prevent the surface of the high-resistance InAlAs layer 4 from being exposed to air and oxidized. Further, the lower coating layer 11 is n type to suppress injection of holes into the high-resistance InAlAs layer 4. In addition, the upper coating layer 13 is p type so that a p-n junction is present between the upper coating layer 13 and a p type InGaAs contact layer to prevent the flow of leakage current. As described in the first embodiment of the invention, the high-resistance InAlAs layer 4 is grown at a relatively low temperature, about 500° C., and the shallow donor concentration $N_{SD}$, the shallow acceptor concentration $N_{SA}$, and the deep donor concentration $N_{DD}$ have relationships of $N_{SA} > N_{SD}$ and $N_{SA} - N_{SD} < N_{DD}$, whereby a high resistivity, exceeding $5\times10^4$ $\Omega$·cm, is realized.

In the step of FIG. 3(d), after removal of the SiN film 7, a p type InGaAs contact layer 8 is grown on the p type InP upper cladding layer 3 and on the p type InP upper coating layer 13. The InGaAs contact layer 8 has a composition that lattice-matches with InP. Thereafter, an SiO$_2$ film 9 is formed on portions of the contact layer 8 except a portion opposite to the ridge 30. Then, a surface electrode (p side electrode) 5 comprising AuZn(100–200 nm)/Au(2 $\mu$m) is formed on a region including the exposed surface of the p type InGaAs contact layer 8, and a rear electrode (n side electrode) 6 comprising AuGe(100–200 nm)/Au(1 $\mu$m) is formed on the rear surface of the InP substrate 100. The Au layers of these electrodes 5 and 6 are formed by electroplating.

As a result, a semiconductor laser device shown in FIG. 3(d) including the high-resistance InAlAs layer 4, the upper coating layer 13, and the lower coating layer 11 which are grown by MOCVD on both sides of the ridge 30 comprising the lower cladding layer 1, the active layer 2, and the upper cladding layer 3 is fabricated.

In this third embodiment, although the high-resistance InAlAs layer 4 contains an easily oxidizable metal, Al, since the surface of that layer 4 is covered by the upper and lower InP layers 13 and 11 which are grown subsequent to the high-resistance layer 4, the surface of the high-resistance layer 4 is not exposed to air and not oxidized when the SiN film 7 is removed. Further, since the InP coating layers do not contain Al, the surface of the upper coating layer is not oxidized even when it is exposed to air. Therefore, the InGaAs contact layer 8 grown on the coating layer has satisfactory crystalline quality. As a result, a satisfactory ohmic contact is realized between the contact layer 8 and the surface electrode 5.

In this third embodiment, after formation of the ridge structure 30 by anisotropically dry etching the semiconductor layers on the InP substrate using the SiN mask 7, the ridge 30 is subjected to isotropic wet etching at both sides, whereby both sides of ridge 30 are positioned within the edges of the SiN film 7. When the ridge 30 is formed by anisotropic dry-etching alone, edges of the ridge are aligned with the both ends of the SiN film 7, in other words, the width of the ridge 30 is the same as the width of the SiN film 7. In this case, when the high-resistance layers 4 and the coating layers 11 and 13 are grown on both sides of the ridge 30 to a thickness equivalent to the height of the ridge 30, these layers easily adhere to both end portions of the surface of the SiN film 7, and portions of the high-resistance layers 4 adhered to the surface of the SiN film are exposed to air when the SiN film is removed. On the other hand, in this third embodiment of the invention, since both sides of the ridge 30 are positioned within the edges of the SiN film 7, the undesired adhesion of the grown layers to the surface of the SiN film 7 is avoided. However, in this third embodiment, since the high-resistance InAlAs layer 4 grown contacting portions of the rear surface of the SiN film 7 which protrude over both sides of the ridge 30, after the SiN film 7 is removed, portions of the high-resistance layer 4 that were in contact with the rear surface of the SiN film 7 are exposed to air and oxidized. However, since the width of the portion of the SiN film 7 protruding over each side of the ridge 30 is equivalent to the thickness of the wet-etched side portion of the ridge, i.e., it is less than 0.1 $\mu$m, the width of the portion of the high-resistance InAlAs layer 4 exposed after the removal of the SiN film 7 is less than 0.1 $\mu$m. Such a narrow portion of the high-resistance layer 4 does not adversely affect the crystalline quality of the p type InGaAs contact layer 8 grown on the high-resistance layer 4.

The dopant impurity contained in the high-resistance InAlAs layer 4 and serving as a shallow acceptor is not restricted to carbon. For example, beryllium or magnesium may be used. When oxygen serving as deep donor is included, the deep donor concentration $N_{DD}$ is increased and the range of the shallow acceptor concentration $N_{SA}$ that satisfies $N_{SA}-N_{SD}<N_{DD}$ is increased, whereby control of $N_{SA}$ is facilitated.

Furthermore, when InAlGaAs is grown under the same growth conditions as those for InAlAs, a similar high-resistance layer is produced.

[Embodiment 4]

Figure 4:
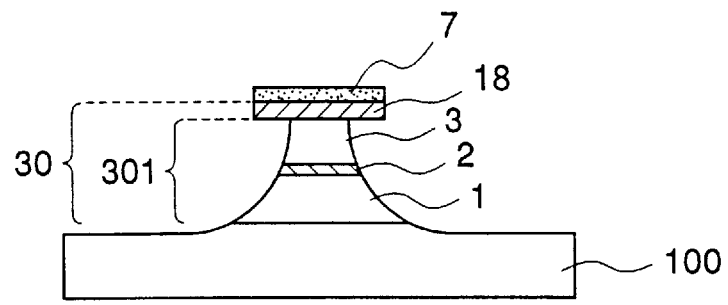
FIGS. 4(a)–4(c) are sectional views illustrating process steps in a method of fabricating a semiconductor laser device according to a fourth embodiment of the present invention.
Figure 4:
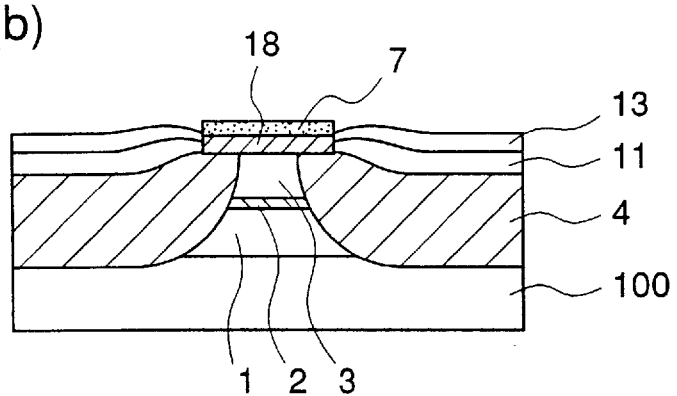
Figure 4:
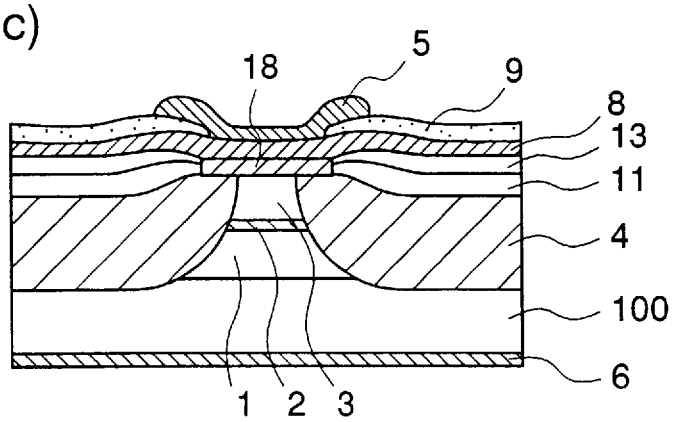

FIGS. 4(a)–4(c) are sectional views illustrating process steps in a method of fabricating a semiconductor laser device including a high-resistance InAlAs layer grown by MOCVD on both sides of a ridge structure and a completed semiconductor laser device (FIG. 4(c)), according to a fourth embodiment of the present invention. In the figures, the same reference numerals as in FIGS. 1(a)–1(d), 2(a)–2(e), and 3(a)–3(d) designate the same or corresponding parts. Reference numeral 18 designates a p type InGaAs cap layer.

Initially, there are successively grown over the entire surface of the n type InP substrate 100, an n type InP lower cladding layer 1 having a thickness of several microns and a dopant concentration of $1\times10^{18}$ cm$^{-3}$, an undoped InGaAsP active layer 2 having a thickness of 10–100 nm, a p type InP upper cladding layer 3 having a thickness of 1 μm and a dopant concentration of $5\times10^{17}$–$1\times10^{18}$ cm$^{-3}$, and a p type InGaAs cap layer 18 having a thickness of 0.1 μm and a dopant concentration of $1\times10^{18}$ cm$^{-3}$. These layers are grown by MOCVD. The composition of InGaAsP for the active layer 2 is selected so that the emission wavelength is in a range of 1.3–1.6 μm and the lattice constant is approximately equal to the lattice constant of InP. The active layer may comprise a quantum well layer as described above. In addition, the InGaAs cap layer 18 has a composition that lattice-matches with InP.

Next, an SiN film 100–200 nm thick is deposited over the entire surface of the p type InGaAs cap layer 18 and patterned by photolithography and etching to form a stripe-shaped SiN film (first insulating film) 7. The stripe direction is perpendicular to the cross-section of the figure. Thereafter, using the SiN film 7 as a mask, only the p type InGaAs cap layer 18 is etched by anisotropic dry etching, such as RIE. The width of the cap layer 18 after the dry etching is the same as the width of the SiN film 7.

In the step of FIG. 4(a), using the SiN film 7 and the InGaAs cap layer 18 under the SiN film 7 as masks, the InP upper cladding layer 3, the InGaAsP active layer 2, and the InP lower cladding layer 1 are selectively wet-etched to form a ridge base 301 comprising portions of the semiconductor layers 1 to 3 under the InGaAs cap layer 18. The etching depth is about 4 μm. Preferably, HCl-based etchant is used for the wet etching. Since the wet etching is isotropic, the etching proceeds not only perpendicular to the surface of the substrate but also parallel to the surface, so that the width of the ridge base 301 becomes narrower than the width of the SiN film 7, i.e., the width of the InGaAs cap layer 18.

Thereafter, as illustrated in FIG. 4(b), using the SiN film as a mask, a high-resistance InAlAs layer 4 is grown by MOCVD to a thickness equivalent to the height of the ridge base 301 and, subsequently, an n type InP lower coating layer 11 and a p type InP upper coating layer 13 are grown on the high-resistance layer 4 so as to fill the spaces at both sides of the ridge base 301, formed by the wet-etching of the semiconductor layers. The high-resistance layer 4 serves as a current blocking layer. The lower and upper coating layers 11 and 13 prevent the surface of the high-resistance InAlAs layer 4 from being exposed to air and oxidized. In addition, the lower coating layer 11 suppresses injection of holes into the high-resistance layer 4, and the upper coating layer 13 prevents leakage current between the upper coating layer 13 and a p type InGaAs contact layer. As described for the first embodiment of the invention, the high-resistance InAlAs layer 4 is grown at a relatively low temperature, about 500° C., and the shallow donor concentration $N_{SD}$, the shallow acceptor concentration $N_{SA}$, and the deep donor concentration $N_{DD}$ have relationships of $N_{SA}>N_{SD}$ and $N_{SA}-N_{SD}<N_{DD}$, whereby a high resistivity, exceeding $5\times10^4$ Ω·cm, is realized. Further, as a result of the low growth temperature, the high-resistance layer 4 adheres closely to the rear surface of the InGaAs cap layer 18 exposed at both sides of the ridge base 301.

In the step of FIG. 4(c), after removal of the SiN film 7, a p type InGaAs contact layer 8 is grown on the p type InGaAs cap layer 18 and on the p type InP upper coating layer 13. The InGaAs contact layer 8 has a composition that lattice-matches with InP. Thereafter, an SiO$_2$ film 9 is formed on portions of the contact layer 8 except a portion opposite to the ridge. Then, a surface electrode (p side electrode) 5 comprising AuZn(100–200 nm)/Au(2 μm) is formed on a region including the exposed surface of the p type InGaAs contact layer 8, and a rear electrode (n side electrode) 6 comprising AuGe(100–200 nm)/Au(1 μm) is formed on the rear surface of the InP substrate 100. The Au layers of these electrodes 5 and 6 are formed by electroplating.

As a result, a semiconductor laser device shown in FIG. 4(c) including the high-resistance InAlAs layer 4, the upper coating layer 13, and the lower coating layer 11 which are grown by MOCVD on both sides of the ridge 30 comprising the ridge base 301 and the cap layer 18 is fabricated.

In this fourth embodiment of the invention, although the high-resistance InAlAs layer 4 contains an easily oxidizable metal, Al, since the surface of that layer 4 is covered by the upper and lower InP layers 13 and 11 and the cap layer 18 which are grown subsequent to the growth of the layer 4, the surface of the high-resistance layer 4 is not exposed to air and oxidized when the SiN film 7 is removed. Further, since the InP coating layers and the cap layer 18 do not contain Al, these layers are not oxidized even when exposed to air. Therefore, the InGaAs contact layer 8 grown on the upper coating layer and on the cap layer has satisfactory crystalline quality. As a result, a satisfactory ohmic contact is realized between the contact layer 8 and the surface electrode 5.

The dopant impurity contained in the high-resistance InAlAs layer 4 and serving as a shallow acceptor is not restricted to carbon. For example, beryllium or magnesium may be used. When oxygen serving as deep donor is included, the deep donor concentration $N_{DD}$ is increased and the range of the shallow acceptor concentration $N_{SA}$ that satisfies $N_{SA}-N_{SD}<N_{DD}$ is increased, whereby control of $N_{SA}$ is facilitated.

Furthermore, when InAlGaAs is grown under the same growth conditions as those for InAlAs, a similar high-resistance layer is produced.

[Embodiment 5]

Figure 5:
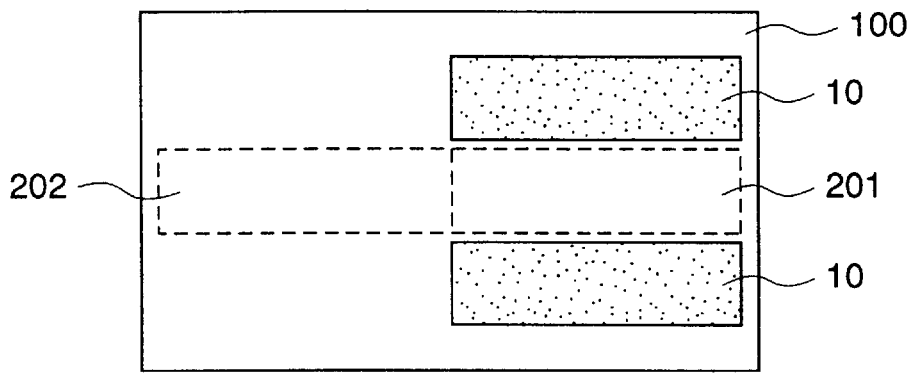
Figure 5:
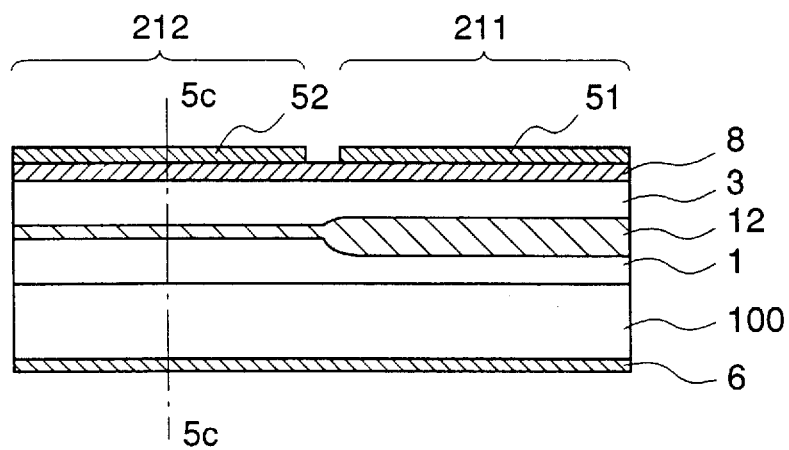
Figure 5:
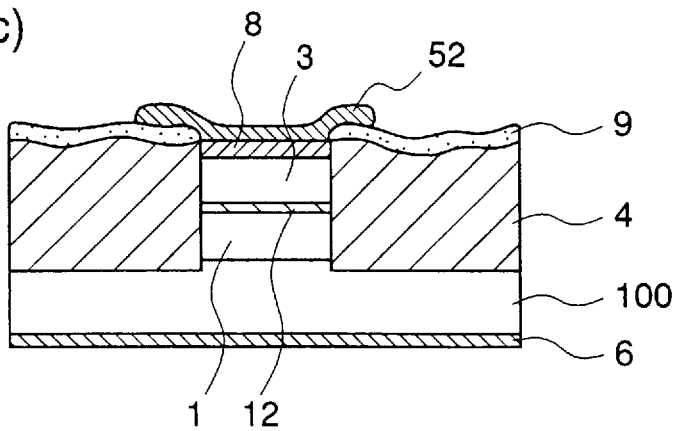
Figure 6:
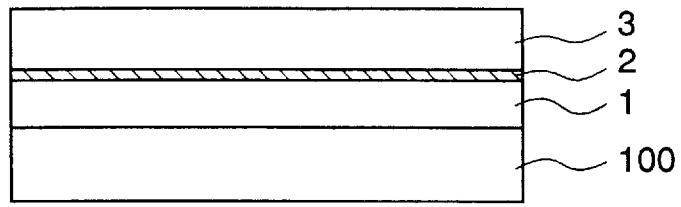
FIGS. 6(a)–6(e) are sectional views illustrating process steps in a method of fabricating a semiconductor laser device according to the prior art.
Figure 6:
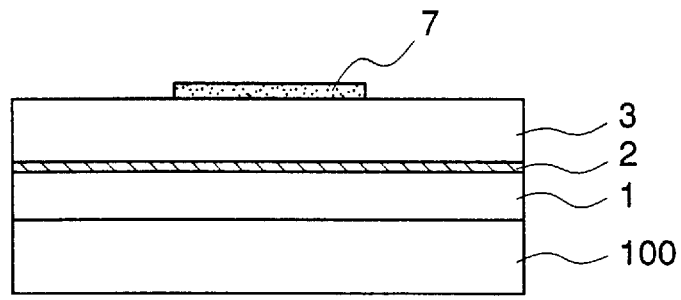
Figure 6:
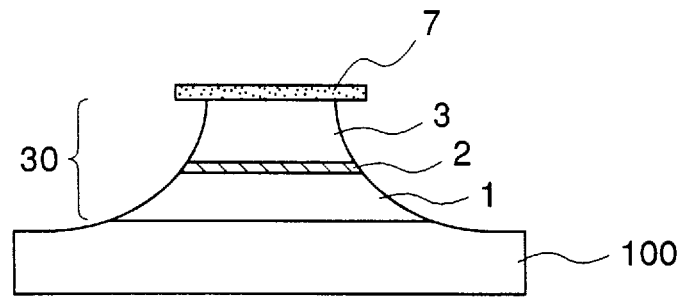
Figure 6:
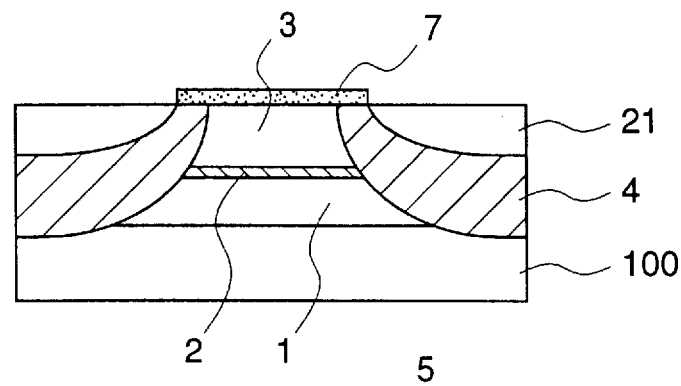
Figure 6:
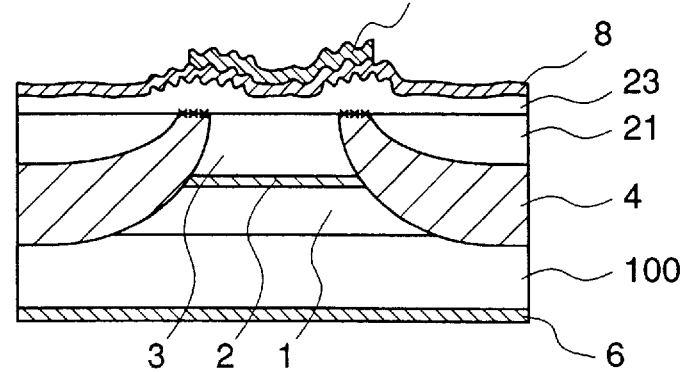

FIGS. 5(a)–5(c) are diagrams for explaining a method of fabricating a semiconductor device including a semiconductor laser and a light modulator which are integrated on the same substrate (hereinafter referred to as an integrated semiconductor laser and light modulator) and high-resistance InAlAs layers grown at both sides of a ridge structure by MOCVD, according to a fifth embodiment of the invention. More specifically, FIG. 5(a) is a plan view illustrating a process step of growing semiconductor layers as constituents of the semiconductor device, FIG. 5(b) is a cross-sectional view of the semiconductor device taken along the longitudinal direction of the ridge structure, and FIG. 5(c) is a sectional view taken along a line 5c—5c in FIG. 5(b). In these figures, the same reference numerals as in FIGS. 1(a)–1(d) designate the same or corresponding parts. Reference numeral 10 designates an insulating film, such as SiO$_2$, numeral 12 designates a multiquantum well (hereinafter referred to as MQW) active layer, numeral 211 designates a semiconductor laser, numeral 212 designates a light modulator, numeral 51 designates a surface electrode (p side electrode) of the semiconductor laser, numeral 52 designates a surface electrode (p side electrode) of the light modulator, numeral 201 designates a region of the substrate 100 where the semiconductor laser is fabricated (hereinafter referred to as laser region), and numeral 202 designates a region of the substrate 100 where the light modulator is fabricated (hereinafter referred to as light modulator region).

Initially, as illustrated in FIG. 5(a), a pair of insulating films 10, such as SiO$_2$, are formed on the surface of the n type InP substrate 100 sandwiching the laser region 201. The light modulator region 202 is adjacent to the laser region 201. Using the insulating films 10 as masks, an n type InP lower cladding layer 1, an MQW active layer 12, a p type InP upper cladding layer 3, and a p type InGaAs contact layer 8 are successively grown on the entire surface of the InP substrate 100. The lower cladding layer 1, the upper cladding layer 3, and the contact layer 8 are identical to those shown for the first embodiment of the invention. The MQW active layer 12 comprises a plurality of quantum wells, and the well layers comprise InGaAsP and the barrier layer comprises InGaAsP, InGaP, or InP. Since the above-described semiconductor layers are not grown on the insulating films 10, those semiconductor layers are thicker in the laser region 201 than in the other region including the light modulator region 202. Accordingly, the width of each quantum well included in the MQW active layer 12 is larger in the laser region 201 than in the light modulator region 202.

Thereafter, as in the first embodiment of the invention, a ridge structure and electrodes are fabricated. More specifically, a stripe-shaped SiN film (first insulating film) is formed on the p type InGaAs contact layer 8 over the laser region 201 and the light modulator region 202. Using the SiN film as a mask, the semiconductor layers on the InP substrate 100 are etched by anisotropic dry etching, such as RIE, forming a stripe-shaped ridge 30 comprising portions of the semiconductor layers beneath the SiN film. The etching depth is about 4 μm. Since the dry etching is anisotropic, the width of the SiN film 7 is approximately equal to the width of the ridge 30. The ridge 30 extends over the laser region 201 and the light modulator region 202. Further, using the SiN film as a mask, a high-resistance InAlAs layer 4 is selectively grown by MOCVD so as to fill the spaces at both sides of the ridge 30, formed by the etching of the semiconductor layers. As described for the first embodiment of the invention, the high-resistance InAlAs layer 4 is grown at a relatively low temperature, about 500° C., and the shallow donor concentration N$_{SD}$, the shallow acceptor concentration N$_{SA}$, and the deep donor concentration N$_{DD}$ have relationships of N$_{SA}$>N$_{SD}$ and N$_{SA}$−N$_{SD}$<N$_{DD}$, whereby a high resistivity, exceeding 5×10$^4$ Ω·cm, is realized.

After removal of the SiN film, an SiO$_2$ film (second insulating film) 9 is formed over the surface of the high-resistance InAlAs layer 4. However, the surface of the p type InGaAs contact layer 8 should be exposed. Thereafter, electrically spaced apart surface electrodes (p side electrodes) 51 and 52 are formed on the contact layer 8 in the laser region 201 and the light modulator region 202, respectively. These surface electrodes comprise AuZn(100–200 nm)/Au(2 μm). Then, a rear electrode (n side electrode) 6 comprising AuGe(100–200 nm)/Au(1 μm) is formed on the rear surface of the InP substrate 100. In this way, an integrated semiconductor laser and light modulator shown in FIGS. 5(b) and 5(c) is completed.

In this semiconductor device, as shown in FIGS. 5(b) and 5(c), the semiconductor laser 211 and the light modulator 212 are integrated on the substrate 100 and include the continuous MQW active layer 12, and the high-resistance InAlAs layer 4 is disposed on both sides of the ridge structure including the active layer 12. In this device, since the width of the quantum well in the MQW active layer 12 is wider in the semiconductor laser 211 than in the light modulator 212, the energy difference between the base level of the conduction band and the base level of the valence band in the quantum well is smaller in the semiconductor laser 211 than in the light modulator 212. Therefore, when no bias voltage is applied to the light modulator 212, laser light produced in the semiconductor laser 211 and transferred to the light modulator 212 is not absorbed in the active layer 12 of the light modulator 212 but passes through the active layer 12. On the other hand, when a reverse bias voltage is applied to the light modulator 212, laser light produced in the semiconductor laser 211 is absorbed in the active layer 12 of the light modulator due to the quantum confining Stark effect (SCSE). In this way, the laser light emitted from the DC-operated semiconductor laser 21 is modulated by changing the bias voltage applied to the light modulator 212.

In this fifth embodiment of the invention, after the selective growth of the high-resistance InAlAs layer 4, when the SiN film is removed, the surface of the high-resistance InAlAs layer 4 is exposed to air and oxidized. However, since no semiconductor layer, such as a contact layer, is regrown on the oxidized surface of the high-resistance InAlAs layer 4, unwanted degradation in crystalline quality of the regrown layer is avoided. Further, since the InGaAs contact layer 8 does not contain oxidizable elements, such as Al, the surface of the contact layer 8 is not oxidized after removal of the SiN film. Therefore, a satisfactory ohmic contact between the contact layer 8 and the surface electrode 51 (52) is realized. As a result, electrical characteristics of the semiconductor laser device are significantly improved.

The dopant impurity contained in the high-resistance InAlAs layer 4 and serving as a shallow acceptor is not restricted to carbon. For example, beryllium or magnesium may be used. When oxygen serving as deep donor is included, the deep donor concentration N$_{DD}$ is increased and the range of the shallow acceptor concentration N$_{SA}$ that satisfies N$_{SA}$−N$_{SD}$<N$_{DD}$ is increased, whereby control of N$_{SA}$ is facilitated.

Furthermore, when InAlGaAs is grown under the same growth conditions as those for InAlAs, a similar high-resistance layer is produced.

While in this fifth embodiment the process steps after the formation of the stripe-shaped ridge are identical to those described for the first embodiment, the process steps may be identical to those described for any of embodiments 2, 3, and 4.

What is claimed is:

1. A semiconductor device fabricated by the process comprising:

forming a stripe-shaped insulating film on a surface of a semiconductor layer;

using the insulating film as a mask, anisotropically dry etching the semiconductor layer to form a stripe-shaped ridge comprising a portion of the semiconductor layer under the insulating film;

using the insulating film as a mask, selectively growing by MOCVD a high-resistance layer selected from InAlAs and InAlGaAs and contacting both sides of the ridge, the high-resistance layer having a shallow donor concentration $N_{SD}$, a shallow acceptor concentration $N_{SA}$, and a deep donor concentration $N_{DD}$ in relationships of $N_{SA} > N_{SD}$ and $N_{SA} - N_{SD} < N_{DD}$, and, subsequently, growing a coating layer over all of the high-resistance layer, the coating layer comprising a semiconductor different in composition from the high-resistance layer and that less readily combines with oxygen than the high-resistance layer;

removing the insulating film;

growing a contact layer, comprising a semiconductor that makes an ohmic contact with a surface electrode that is later produced on the ridge and on the coating layer; and producing a surface electrode on the contact layer and a rear electrode on the semiconductor substrate.

2. The semiconductor device of claim 1 wherein:

the semiconductor layer comprises a first conductivity type semiconductor substrate, a first conductivity type semiconductor lower cladding layer having a band gap energy, an undoped semiconductor active layer comprising a quantum well structure in which the well layer comprises a semiconductor having a band gap energy smaller than the band gap energy of the lower cladding layer, and a second conductivity type, opposite the first conductivity type, a semiconductor upper cladding layer having a band gap energy larger than the band gap energy of the well layer, these layers being successively disposed on a first region of the substrate where a semiconductor laser is present and on a second region of the substrate, adjacent to the first region, where a light modulator is present, with the first region being between a pair of insulating films serving as masks for selective growth;

the stripe-shaped ridge extends through the first and second regions;

the laser produces laser light;

the modulator absorbs the laser light due to the quantum confining Stark effect;

the surface electrode comprises a first surface electrode and a second surface electrode disposed on the stripe-shaped ridge opposite the first region and the second region, respectively, the first and second surface electrodes being electrically separated from each other;

a rear electrode is disposed on the semiconductor substrate; and the active layer is continuous through the first and second regions.

3. A semiconductor device fabricated by the process comprising:

growing a cap layer on a semiconductor base layer, the cap layer comprising a semiconductor different from the semiconductor of the base layer;

forming a stripe-shaped insulating film on the cap layer;

using the insulating film as a mask, anisotropically dry etching the cap layer and, subsequently, using the insulating film and the cap layer under the insulating film as masks, selectively wet etching the semiconductor base layer to form a stripe-shaped ridge base part comprising a portion of the semiconductor base layer and having both sides inwardly spaced from respective edges of the cap layer, thereby forming a stripe-shaped ridge structure comprising parts of the cap layer and the ridge base part;

using the insulating film as a mask, growing by MOCVD a high-resistance layer selected from InAlAs and InAlGaAs and contacting both sides of the ridge base part and contacting portions of a rear surface of the cap layer exposed at both sides of the ridge base part, the high-resistance layer having a shallow donor concentration $N_{SD}$, a shallow acceptor concentration $N_{SA}$, and a deep donor concentration $N_{DD}$ in relationships of $N_{SA} > N_{SD}$ and $N_{SA} - N_{SD} < N_{DD}$, and, subsequently, growing a coating layer over all of the high-resistance layer, the coating layer comprising a semiconductor different in composition from the high-resistance layer and that less readily combines with oxygen than the high-resistance layer;

removing the insulating film;

growing a contact layer, comprising a semiconductor that makes an ohmic contact with a surface electrode that is later produced, on the ridge and on the coating layer; and producing a surface electrode on the contact layer and a rear electrode on the semiconductor substrate.

4. The semiconductor device of claim 3 wherein:

the semiconductor base layer comprises a first conductivity type semiconductor substrate, a first conductivity type semiconductor lower cladding layer having a band gap energy, an undoped semiconductor active layer comprising a quantum well structure including a well layer comprising a semiconductor having a band gap energy smaller than the band gap energy of the lower cladding layer, a second conductivity type, opposite the first conductivity type, a semiconductor upper cladding layer having a band gap energy larger than the band gap energy of the well layer, these layers being successively disposed on a first region of the substrate where a semiconductor laser is present and on a second region of the substrate, adjacent to the laser region, where a light modulator is present, with the first region being between a pair of insulating films serving as masks for selective growth;

the cap layer comprises a second conductivity type semiconductor;

the stripe-shaped ridge extends through the first region and the second region;

the laser produces laser light;

the modulator absorbs the laser light due to the quantum confining Stark effect;

the surface electrode comprises a first surface electrode and a second surface electrode disposed on the stripe-shaped ridge opposite the first region and the second region, respectively, the first and second surface electrodes being electrically separated from each other;

a rear electrode is disposed on the semiconductor substrate; and the active layer is continuous over the first and second regions.

* * * * *